United States Patent [19]

Lord

[11] 4,361,749
[45] Nov. 30, 1982

[54] UNIFORMLY COOLED PLASMA ETCHING ELECTRODE

[75] Inventor: Herbert A. Lord, East Windsor, N.J.

[73] Assignee: Western Electric Co., Inc., New York, N.Y.

[21] Appl. No.: 203,748

[22] Filed: Nov. 3, 1980

Related U.S. Application Data

[62] Division of Ser. No. 118,002, Feb. 4, 1980, Pat. No. 4,275,289.

[51] Int. Cl.³ .................................................. B23K 9/00
[52] U.S. Cl. ........................ 219/121 PD; 219/121 PG; 219/121 PF; 219/121 PR; 156/643; 165/154; 165/169
[58] Field of Search ............... 219/121 PD, 121 PE, 219/121 PF, 121 PG, 121 PH, 121 PN, 121 PR, 76.11, 291, 293, 303; 204/192 E, 192 D; 156/643, 646; 165/154, 156, 169; 250/540, 541, 547; 313/32, 34; 336/61, 62

[56] References Cited

U.S. PATENT DOCUMENTS

| | | | |
|---|---|---|---|
| 3,293,868 | 12/1966 | Gonzalez | 219/303 |
| 3,307,619 | 3/1967 | Dae Sik Kim | 165/156 |
| 3,598,710 | 8/1971 | Davidse | 204/192 E |
| 3,664,942 | 5/1972 | Havas et al. | 219/121 PF |
| 3,757,733 | 9/1973 | Reinberg | 204/192 E |
| 3,907,028 | 9/1975 | Lawson | 165/156 |
| 3,984,301 | 10/1976 | Matsuzaki et al. | 204/192 E |

*Primary Examiner*—M. H. Paschall
*Attorney, Agent, or Firm*—D. J. Kirk

[57] ABSTRACT

A planar electrode (17) having a plurality of concentric channels (34-34) therein through which coolant fluid passes to cool the electrode during a plasma etching process. The coolant is directed through at least two of the adjacent channels in opposite directions with the inputs (31) and outputs (32) located in close spaced relation to one another to provide a substantially uniform temperature on the surface of the electrode proximate thereto.

4 Claims, 7 Drawing Figures

IN   OUT

FIG.-5
FIG.-6
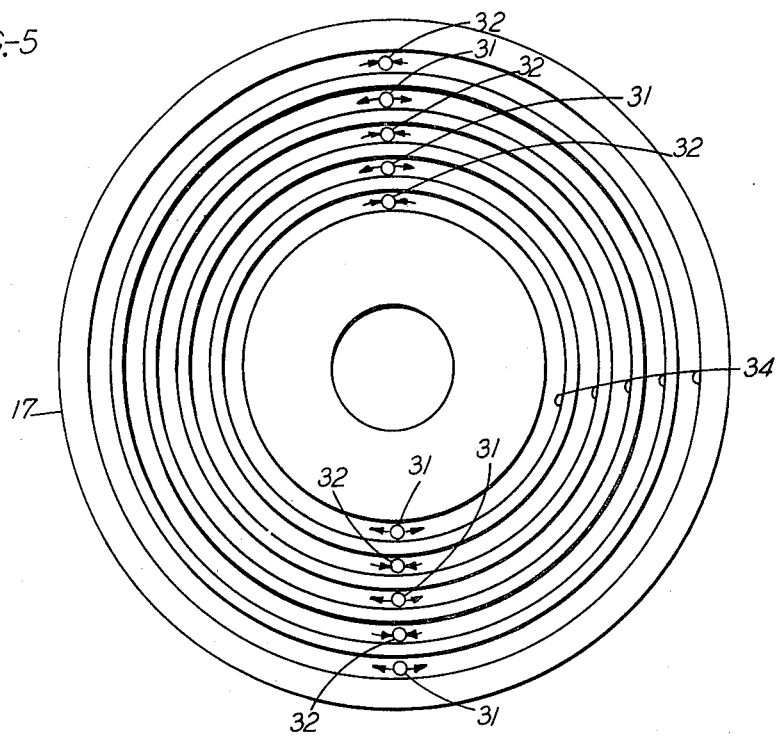
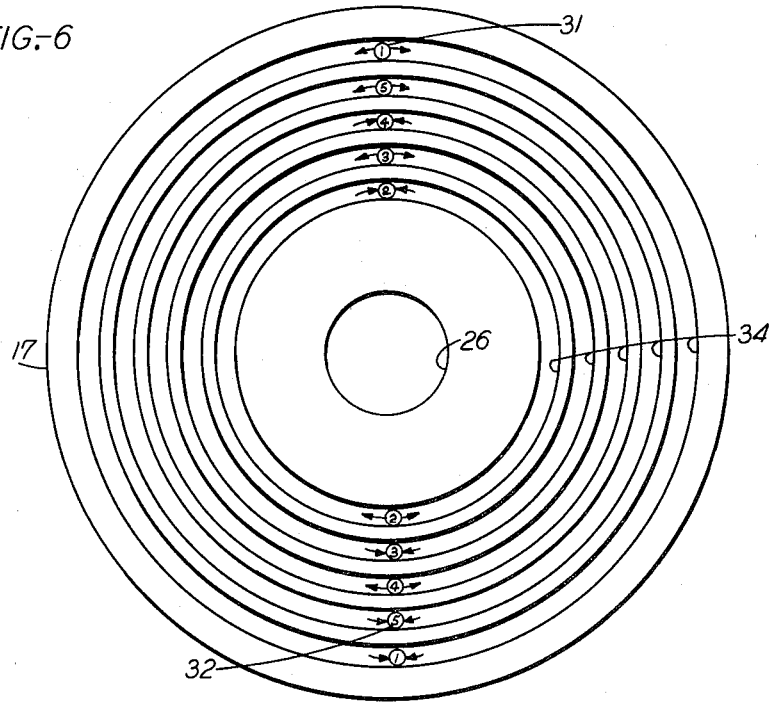

UNIFORMLY COOLED PLASMA ETCHING ELECTRODE

This is a division of application Ser. No. 118,002 filed Feb. 4, 1980 now U.S. Pat. No. 4,275,289.

TECHNICAL FIELD

This invention is related to techniques for plasma etching semiconductor wafers. In particular, the invention is directed to an apparatus for uniformly cooling electrodes used in a plasma etching machine.

BACKGROUND OF THE INVENTION

It is well known to selectively etch portions of a semiconductor wafer (e.g., silicon), by forming a patterned photoresist mask on the semiconductor wafer and placing the masked wafer in a reactive gas plasma. The plasma etches the semiconductor material exposed through the patterned mask.

A plasma etch may be carried out in an evacuated reaction chamber, for example, the reaction chamber disclosed by Reinberg in U.S. Pat. No. 3,757,733, which issued on Sept. 11, 1973, which patent is incorporated by reference herein. A typical reaction chamber has a pair of spaced apart planar electrodes. In operation, a number of masked silicon wafers are placed on the flat top surface of the bottom electrode. The top electrode is lowered to about one-half inch above the wafers, the chamber is sealed, evacuated and purged. Etching gas, such as FREON 23, is introduced into the chamber, and an electrical potential is applied across the electrodes to create a plasma therebetween. After etching is completed, the system is purged, brought back up to atmospheric pressure, opened and the etched wafers removed for further processing.

The etch rate associated with plasma etching of silicon semiconductor material is known to be temperature dependent. If the temperature of any surface falls below about 15° C. a polymer from the FREON 23 gas in the system deposits out on that surface and prevents further etching. If the temperature exceeds about 40° C., the photoresist mask is excessively attacked. Within the workable temperature range of about 20° to 40° C., the etch rates on each of the different surface materials present (Si, SiO$_2$, photoresist) vary, so temperature variations within this 20° to 40° C. range affect product uniformity. Additionally, because etch rates are affected by moisture in the system, it is necessary that the temperatures of the electrodes not fall below the dew point, so it is considered desirable to have the electrodes hot when the reaction chamber is opened.

A well known technique for cooling a planar electrode is to cause a coolant (e.g., water, ethylene glycol) to simultaneously flow into a plurality of concentric channels within the planar electrode and be removed at an outlet located about 180° from the inlet. However, such systems reveal temperature differences between the coolant inlet and the outlet locations of about 10° C. Accordingly, wafers resting upon such an electrode would be at approximately the same temperature and would exhibit the aforementioned problems.

Accordingly, there is a need for a technique for uniformly cooling electrodes in a plasma etching facility.

SUMMARY OF THE INVENTION

The instant invention overcomes the foregoing problem with an apparatus for uniformly cooling a substantially planar electrode to within a predetermined temperature range, the electrode having a plurality of concentric channels therein separated by a plurality of concentric walls, and a cooling fluid flowing through said channels during a plasma etching process. The coolant fluid is caused to flow along the channels in such a manner that the temperature of the fluid in any one channel is different than the temperature of the fluid in the adjacent channel and the average temperature of each adjacent pair falls within the predetermined temperature range.

BRIEF DESCRIPTION OF THE DRAWINGS

FIGS. 5 and 6 are schematic illustrations of the coolant flow paths in exemplary embodiments of the instant invention.

DETAILED DESCRIPTION

Figure 1:
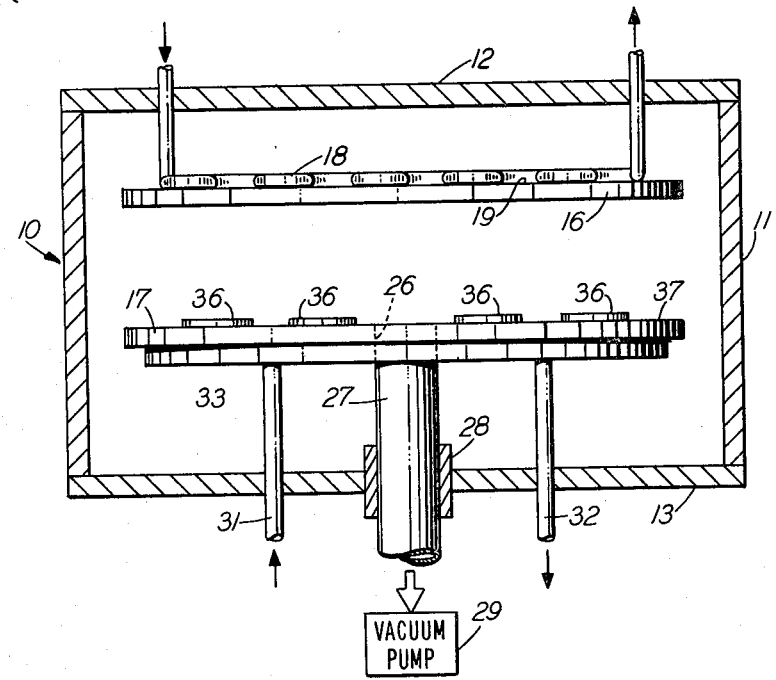
FIG. 1 is a partial cross-sectional view of a prior art reaction chamber.

FIG. 1 is a partial cross-sectional view of a typical plasma etching chamber, generally indicated by the numeral 10. The chamber 10 is comprised of a hollow, cylindrical member 11 having upper and lower end plates 12 and 13, respectively. A pair of cylindrical, spaced-apart, disc-shaped top and bottom electrodes 16 and 17, respectively, are positioned within the chamber 10. Top electrode 16 has a cooling coil 18 in contact with the upper surface 19 thereof (also, see FIG. 2). The bottom electrode 17, which can be made of aluminum or the like, has a central aperture 26 and is fixedly connected to a hollow metal pipe 27 which is insulated from the lower end plate 13 by a hermetic bushing 28. The lower end of the pipe 27 is connected to a vacuum pump 29 which serves to maintain a vacuum within the chamber 10 and also to remove spent gases therein. Coolant input conduit 31 and output conduit 32 are connected to a base plate 33 and the coolant (source not shown) flows through the bottom electrode 17 as will hereinafter be described.

Figure 2:
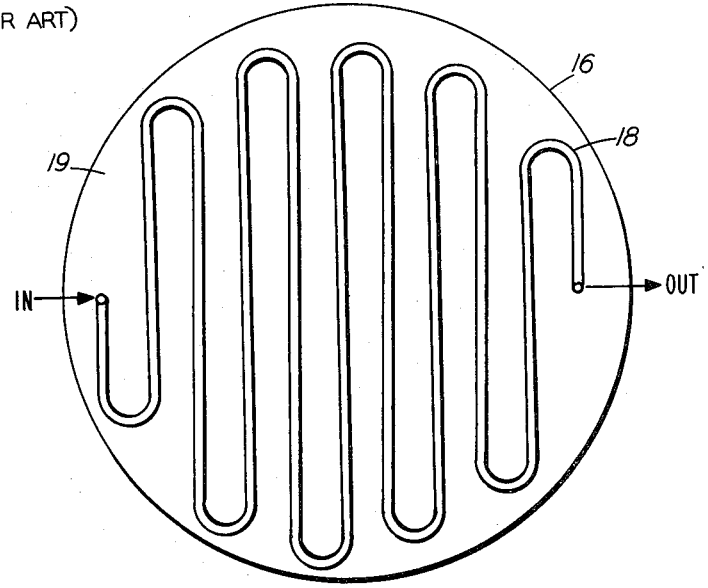
FIG. 2 is a plan view of a top plasma etching electrode.
Figure 3:
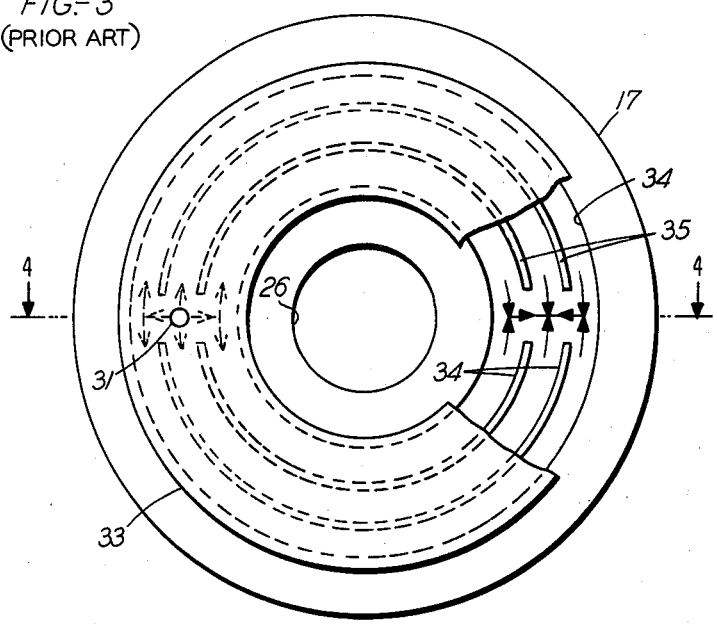
FIG. 3 is a bottom view of a prior art bottom plasma etching electrode.
Figure 4:
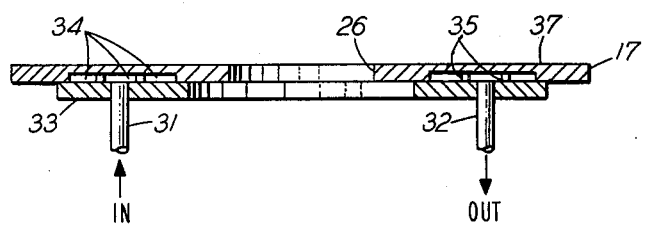
FIG. 4 is a cross-sectional view of the electrode shown in FIG. 3.

FIGS. 2 to 4 are various views of electrodes used in prior art plasma etching apparatus. FIG. 2 is a top view of the top electrode 16 with the cooling coil 18 thereon. FIG. 3 is a bottom view of the bottom electrode 17 which shows a plurality of concentric channels 34—34 therein separated by walls 35—35. FIG. 4 is a cross-sectional view of the bottom electrode 17.

In operation, a plurality of semiconductor wafers 36—36, approximately 0.020 inch thick, are placed on the top surface 37 of the bottom electrode 17 as shown in FIG. 1. The chamber 10 is then sealed and a gas (e.g., FREON 23, FREON 116 or the like) is directed into the chamber from a source not shown. A radio frequency electrical potential is impressed across electrodes 16 and 17 to cause a plasma to form therebetween which plasma deposits on the wafers 36—36 to selectively etch the wafers through an apertured photoresist mask thereon (not shown).

During the plasma etching process, heat is generated due to electrical current passing through the plasma and temperature variations can exist within the chamber 10. Such temperature variations can have deleterious effects on the plasma etching process, as hereinbefore set forth.

In order to maintain the temperature of the electrodes 16 and 17 within the desired limits, the cooling arrangements shown in FIGS. 2 and 3 have been used to cool the top and bottom electrodes, respectively. Cooling fluid (e.g., water, ethylene glycol) having an input temperature of about 20° C. was directed (see FIG. 2) through the cooling coil 18 on the upper surface 19 of the top electrode 16. The bottom electrode 17 was cooled by passing the cooling fluid through the channels 34—34 (see FIGS. 3 and 4). More specifically, the cooling fluid was directed into the conduit 31 (FIG. 1) and was simultaneously distributed into each channel 34 as indicated by the arrows shown in FIG. 3. Diverging arrows indicate cooling fluid flowing into channels 34 while converging arrows indicate fluid flowing out of the channel. The fluid passed through the concentric channels 34—34 and simultaneously exited through conduit 32 which was located diametrically opposite the input conduit 31.

Contact heat probe measurements made immediately after the chamber 10 was opened indicated a substantially uniform temperature over the surface of the top electrode 16. However, temperature differences on the order of 10° C. were measured on the surface 37 between the areas surrounding the input and output conduits 31 and 32, respectively. The wafers 36—36 were, of course, in direct contact with the surface 37, and presumably were at approximately the same temperature as the region they contacted resulting in the aforementioned problems.

The upper electrode 16 was maintained at a uniform temperature due to the fact that its preferred temperature is substantially the same as the coolant source (e.g. 20° C.). This can be accomplished by simply passing the coolant fluid through the coil 18 at a very high velocity resulting in the coolant fluid input and output temperatures being substantially the same. However, it is preferred that the lower electrode 17 temperature be maintained slightly higher than the top electrode 16 which presents difficulties in maintaining temperature uniformity over the surface of the lower electrode.

The instant invention overcomes the foregoing problem by flowing the coolant fluid along the channels 34—34 in such a manner that the temperature of the fluid in any one channel is different than the temperature of the fluid in the adjacent channel wherein the average temperature of each adjacent pair of channels falls within a predetermined temperature range resulting in a substantially uniform temperature in the bottom electrode 17.

The coolant fluid flow also may be arranged so that the flow direction is opposite in adjacent channels 34—34 to enhance heat transfer therebetween. Additionally, the coolant fluid flowing into a channel 34 is at a location that is proximate the fluid which is flowing out of an adjacent channel and vice-versa. Such arrangements tend to further equalize the temperatures along the length of the channels 34—34. This configuration substantially reduces the temperature variation from one point to another on the bottom electrode 17 while permitting the temperature level to be controlled by adjusting the coolant fluid flow rate.

In an exemplary arrangement shown in FIG. 5, coolant fluid simultaneously flows into all channels 34—34 at conduits 31—31 indicated by the diverging arrows while the fluid simultaneously flows out of the channels at conduits 32—32 indicated by the converging arrows. As can further be seen, the coolant fluid inputs and outputs alternate and are located in close spaced relation and along the same diameter of the electrode 17 to substantially increase the uniformity of the temperature of the electrode 17.

As shown in FIG. 5, the walls 35—35 are continuous. Various plumbing arrangements (not shown) can be fabricated by one having ordinary skill in the art to simultaneously direct and remove coolant fluid into and from the channels 34—34 as indicated in FIG. 5.

FIG. 6 is a specific exemplary working embodiment incorporating the instant inventive concepts. In this embodiment, coolant fluid flows into the outer channel 34 at via conduit 31, passes sequentially through all the channels 34—34 via interconnecting conduits (not shown) and leaves through the output conduit 32. The numerals 1, 2, 3, 4 and 5 indicate both the sequence of the passage of the coolant through the channels as well as the relative levels of the temperature therein. Accordingly, the coolant fluid flows through the outer channel as indicated by the arrows and flows out of the outer channel at the location having converging arrows. The fluid then passes through interconnecting conduit (not shown) into the inner channel designated 2 thence through channels 3, 4 and 5 with the fluid returning to a reservoir (not shown) via the conduit 32 in channel 5. Such an arrangement provides a sequential or serial flow of the fluid through all the channels 34—34. Plumbing connections between the channels are not shown for purposes of clarity.

It can be seen that the highest temperature fluid (channel 5) is located adjacent to the lowest temperature fluid (channel 1) to provide an average temperature intermediate those temperatures. It should be noted that the outer channel has the coolant fluid flowing in the same direction as the adjacent channel. This was necessary due to particular space limitations on the apparatus used. Although this arrangement proved to be effective, optimally the flow direction should be reversed in channel 1. However, the flow pattern used in the channels 34—34 of FIG. 6 proved most effective for the different temperatures in the adjacent channels tended to average to an intermediate temperature range between the hottest and coldest channels resulting in a substantially uniform temperature on the surface of the electrode 17 as can be clearly seen in FIG. 7.

Figure 7:
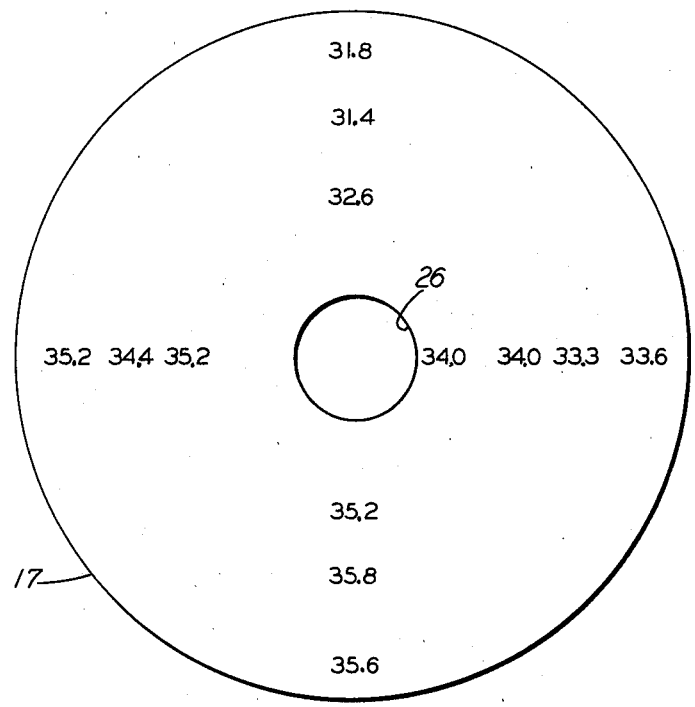
FIG. 7 depicts bottom electrode temperatures in an exemplary embodiment of the instant invention.

FIG. 7 represents temperature measurements at various locations on the surface 37 of the bottom electrode 17, shown in FIG. 6 immediately after a plasma etching run was completed. Of the twelve points probed, the maximum temperature difference measured was 4.4° C. which was substantially below the typical temperature difference of the prior art design.

It should be clear that various modifications may be made to the instant embodiments without departing from the spirit and scope of the invention.

What is claimed is:

1. An apparatus for uniformly cooling a substantially planar electrode to within a predetermined temperature range, comprising:
   the electrode having a plurality of concentric channels therein separated by a plurality of continuous concentric walls;

all channels have a coolant fluid input and output positioned along a single diameter of the electrode; and the inputs and outputs of adjacent channels are positioned on opposite sides of the wall therebetween to direct coolant flows in opposite directions in adjacent channels.

2. The apparatus as set forth in claim 1, wherein: the coolant fluid inputs are adapted to simultaneously receive a coolant fluid.

3. The apparatus as set forth in claim 1, wherein: the coolant fluid inputs and outputs are connected to direct a coolant fluid to flow sequentially through all channels.

4. A planar plasma etching electrode having a planar upper surface and a plurality of concentric channels therein separated by a plurality of concentric walls, wherein:

each of the concentric walls are continuous; and all channels have a coolant input and a coolant output which are positioned on a single diameter of the electrode for flowing a coolant along adjacent channels in opposite directions, with the coolant in contact with the upper surface, in such a manner that the temperature of the coolant in any one channel is different than the temperature of the coolant in the adjacent channel and the average temperature of each adjacent pair of channels falls within a predetermined range to provide a substantially uniform temperature over the upper surface of the electrode.

* * * * *